United States Patent
Ichihara et al.

(10) Patent No.: US 9,196,803 B2
(45) Date of Patent: Nov. 24, 2015

(54) SEMICONDUCTOR LIGHT EMITTING ELEMENT AND METHOD FOR MANUFACTURING THE SAME

(75) Inventors: Takashi Ichihara, Shah Alam (MY); Hiroaki Kageyama, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/110,794

(22) PCT Filed: Apr. 2, 2012

(86) PCT No.: PCT/JP2012/058966
§ 371 (c)(1),
(2), (4) Date: Oct. 9, 2013

(87) PCT Pub. No.: WO2012/141031
PCT Pub. Date: Oct. 18, 2012

(65) Prior Publication Data
US 2014/0034992 A1    Feb. 6, 2014

(30) Foreign Application Priority Data

Apr. 11, 2011  (JP) ................ 2011-087077
Aug. 16, 2011  (JP) ................ 2011-178041

(51) Int. Cl.
*H01L 33/00* (2010.01)
*H01L 33/56* (2010.01)
(Continued)

(52) U.S. Cl.
CPC ............ *H01L 33/56* (2013.01); *H01L 33/44* (2013.01); *H01L 33/46* (2013.01); *H01L 33/60* (2013.01); *H01L 33/20* (2013.01); *H01L 33/38* (2013.01)

(58) Field of Classification Search
CPC ......... H01L 33/26; H01L 33/44; H01L 33/56; H01L 33/38; H01L 33/60; H01L 2924/12041
USPC ......................................... 257/80, 81, 86, 98
See application file for complete search history.

(56) References Cited

U.S. PATENT DOCUMENTS 6,042,652 A    3/2000   Hyun et al.
2003/0052328 A1  3/2003   Uemura
(Continued)

FOREIGN PATENT DOCUMENTS

JP    2000-319772 A    11/2000
JP    2003-168823 A    6/2003
(Continued)

OTHER PUBLICATIONS

English Machine Translation of Ichikawa et al. (JP 2006-41403 A).*
(Continued)

*Primary Examiner* — Brook Kebede
(74) *Attorney, Agent, or Firm* — Global IP Counselors, LLP (57) ABSTRACT

[Object]
[Means for Solving Problem] A method for manufacturing of a semiconductor light emitting element has; forming a semiconductor layer laminated of a first conductivity type semiconductor layer, a light emitting layer and a second conductivity type semiconductor layer, in this order, forming an electrode including a silver-containing layer in contact with an upper surface of the second conductivity type semiconductor layer, forming an insulating layer coating over at least a side surface of the silver-containing layer from the upper surface of the second conductivity type semiconductor layer by an atomic layer deposition method.

20 Claims, 4 Drawing Sheets (51) Int. Cl.
*H01L 33/44* (2010.01)
*H01L 33/60* (2010.01)
*H01L 33/46* (2010.01)
*H01L 33/20* (2010.01)
*H01L 33/38* (2010.01)

(56) References Cited

U.S. PATENT DOCUMENTS

2005/0112282 A1   5/2005   Gordon et al.
2008/0279241 A1*  11/2008  Oki et al. .................. 372/45.01
2008/0303075 A1   12/2008  Setokubo
2012/0049225 A1   3/2012   Wakaki

FOREIGN PATENT DOCUMENTS

| JP | 2005-521792 A |   | 7/2005 |
| JP | 2006041403 A | * | 2/2006 |
| JP | 2006-161061 A |   | 6/2006 |
| JP | 2008-306139 A |   | 12/2008 |
| JP | 2012-069539 A |   | 4/2012 |
| WO | 03-083167 A1 |   | 10/2003 |

OTHER PUBLICATIONS

Hiller et al., Low temperature silicon dioxide by thermal atomic layer deposition: Investigation of material property, Journal of Applied Physics 107, 064314, Nov. 5, 2010.*

* cited by examiner

SEMICONDUCTOR LIGHT EMITTING ELEMENT AND METHOD FOR MANUFACTURING THE SAME

CROSS-REFERENCE TO RELATED APPLICATIONS

This application claims priority to Japanese Application No. 2011-087077 filed on Apr. 11, 2011 and Japanese Application No. 2011-178041 filed on Aug. 16, 2011. The entire disclosures of Japanese Application Nos. 2011-087077 and 2011-178041 are incorporated herein by reference.

TECHNICAL FIELD

The present invention relates to a semiconductor light emitting element and a method for manufacturing the same.

BACKGROUND ART

Conventionally, in semiconductor light emitting elements, in particular light emitting diodes (LEDs), the light output can be increased by providing a reflective film that includes silver or the like as an electrode to prevent the absorption of light emitting from the light emitting layer. Also, a protective film comprising an insulating material and a metallic material is formed using a sputtering method, a vapor deposition method or the like to prevent a reduction in the light-reflecting action due to migration or discoloration or the like of this reflective film (JP2003-168823-A, etc.).

Conventional semiconductor light emitting elements can reduce migration, discoloration or the like by a protective film comprising a metallic material, but it is still not possible to inhibit migration or discoloration or the like. Consequently, there is a problem in that a reduction in output is unavoidable. In other words, because the protective film material is supplied to the wafer isotropically using the sputtering method or vapor deposition method, the structure of the semiconductor layer itself or the like becomes an obstacle, for example, in the side and corner portions of an electrode that includes a reflective film, and it is not possible to form the protective film uniformly. For this reason, it is necessary to increase the thickness of the protective film to prevent migration or discoloration of the reflective film. Thus, there is a problem that such a thick protective film becomes the walls to absorb the light emitted from the light emitting element, which leads to a decrease in light output.

SUMMARY

Taking account of the aforementioned problems, the present invention has the goal of providing a semiconductor light emitting element that can suppress discoloration of reflective films and maintain high light output, and to provide a method for manufacturing the same.

The present application includes the following inventions.

[1] A method for manufacturing a semiconductor light emitting element has; forming a semiconductor layer laminated of a first conductivity type semiconductor layer, a light emitting layer and a second conductivity type semiconductor layer, in this order; forming an electrode including a silver-containing layer in contact with an upper surface of the second conductivity type semiconductor layer, forming an insulating layer coating over at least a side surface of the silver-containing layer from the upper surface of the second conductivity type semiconductor layer by an atomic layer deposition method.

[2] The method for manufacturing of the semiconductor light emitting element according to [1], wherein the insulating layer is an aluminum oxide or silicon dioxide.

[3] The method for manufacturing of the semiconductor light emitting element according to [1] or [2], wherein the insulating layer has substantially uniform thickness such that the variations in thickness falls within ±20%.

[4] A semiconductor light emitting element has; a semiconductor layer laminated of a first conductivity type semiconductor layer, a light emitting layer and a second conductivity type semiconductor layer, in this order; an electrode including a silver-containing layer in contact with an upper surface of the second conductivity type semiconductor layer, an insulating layer coating over at least a side surface of the silver-containing layer from the upper surface of the second conductivity type semiconductor layer, the insulating layer has substantially uniform thickness over at least a side surface of the silver-containing layer from the upper surface of the second conductivity type semiconductor layer.

[5] The semiconductor light emitting element according to [4], wherein the insulating layer is a layer formed by an atomic layer deposition method.

[6] The semiconductor light emitting element according to [4] or [5], wherein the insulating layer is an aluminum oxide or silicon dioxide.

[7] The semiconductor light emitting element according to any one of [4] to [6], wherein the insulating layer has substantially uniform thickness such that the variations in thickness falls within ±20%.

According to the present invention, a semiconductor light emitting element that can suppress discoloration of reflective films and maintain high light output, and a method for manufacturing the same, can be provided.

BRIEF DESCRIPTION OF THE DRAWINGS

FIG. 1 includes diagrams A and B, in which A is a planar view that illustrates the structure of the semiconductor light emitting element of the present invention, and B is a schematic cross-sectional diagram along the line A-A' in FIG. 1A.

DETAILED DESCRIPTION OF THE PREFERRED EMBODIMENTS

Preferred embodiments of the present invention are explained below with reference to the diagrams. However, the embodiments shown below are examples of semiconductor light emitting elements to substantiate the technical idea of the present invention, and following do not define the semiconductor light emitting element of the present invention. Furthermore, in the explanations below, where the same name or symbol represents a component that is the same or essentially the same, a detailed explanation will be appropriately omitted.

Figure 1:
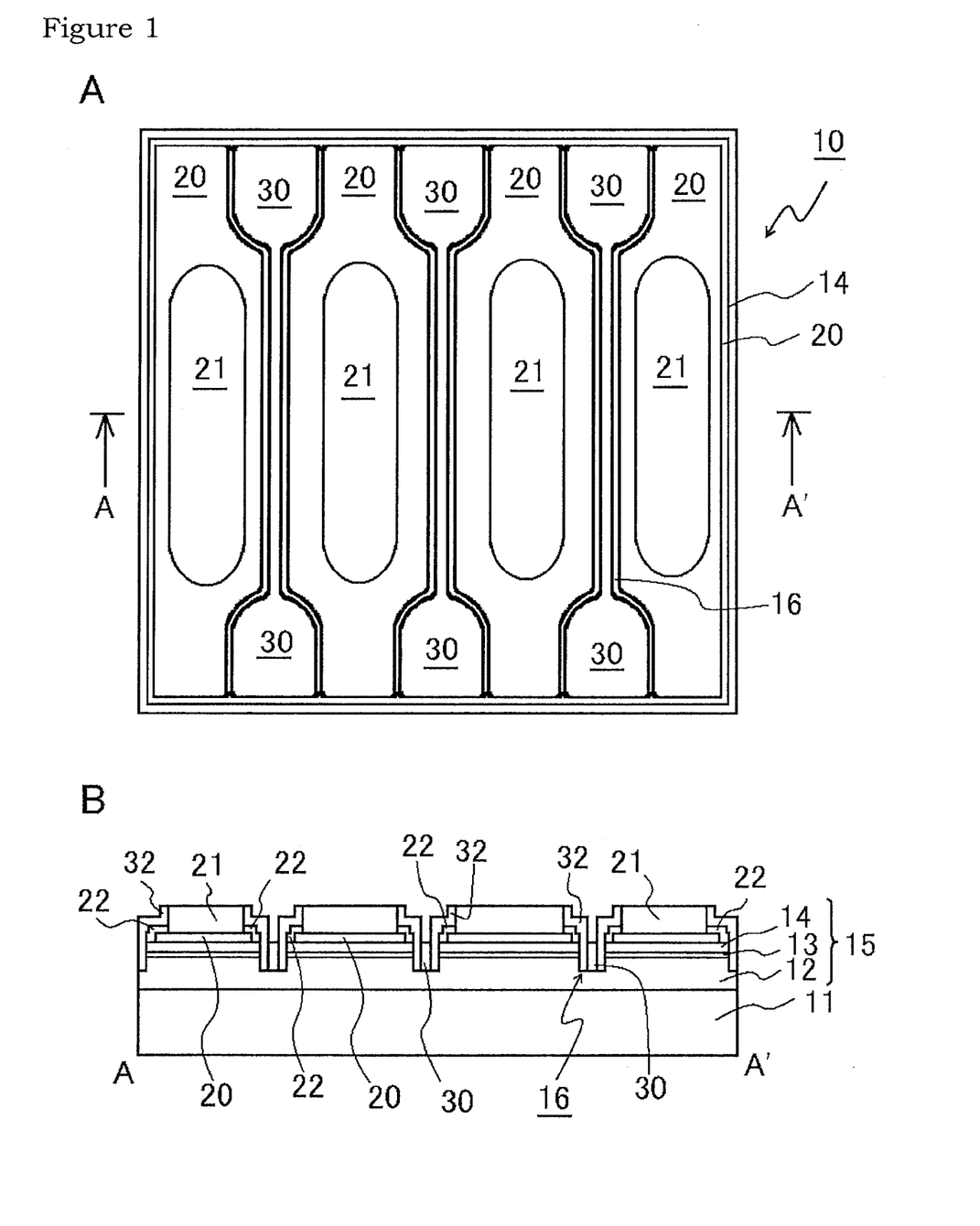

As shown in FIG. 1A and FIG. 1B, a semiconductor light emitting element 10 of the present invention is formed from a semiconductor layer 15 which is laminated on a substrate 11 in this order of a first conductivity type (hereinafter may be referred to as "n-type") semiconductor layer 12, a light emitting layer 13 and a second conductivity type (hereinafter may be referred to as "p-type") semiconductor layer 14, with one or a plurality optional buffer layers interposed between the semiconductor layer 15 and the substrate 11 (not shown in the figure). In the semiconductor layer 15, exposed portions 16 are formed by partial removal starting from the second conductivity type semiconductor layer 14 being in the thickness direction such that the first conducting n-type semiconductor layer 12 is exposed. The exposed portions 16 can be formed at arbitrary positions in arbitrary numbers/sizes, but here three exposed portions 16 are formed so as to connect the opposite edges of the light emitting element 10.

An insulating layer and a protective film are omitted to show in FIG. 1A, which primarily shows the planar arrangement of the semiconductor layer and an electrode.

Electrode 20

An electrode 20 including a silver-containing layer is formed on the upper surface of the second conductivity type semiconductor layer 14 of the semiconductor light emitting element 10. The electrode 20 is in direct contact with the second conductivity type semiconductor layer 14, preferably by an ohmic connection. The ohmic connection has the meaning as it is generally used in the art and, for example, its current-voltage characteristics indicate a linear or substantially linear connection. In addition, this means that any voltage drop and power loss at the junction during device operation are low enough to be ignored.

Since the electrode 20 is designed for the highly efficient reflection of the light from the light emitting layer 13, it is preferably formed on a broad area over substantially the entire surface of the second conductivity type semiconductor layer 14. The substantially entire surface indicates regions other than the outer fringe of the second conductivity type semiconductor layer 14 exposed on the upper surface and the outer fringe of the exposed portion, for example, 90% or more of the surface area of the light emitting element, preferably 95% or more. In this way, the electrodes 20 having the maximum area of contact with the second conductivity type semiconductor layer 14, the driving voltage can be reduced by lowering the contact resistance. Additionally, the light from the light emitting layer 13 can be reflected from substantially the entire surface area of the second conductivity type semiconductor layer 14 and the light extraction efficiency can be increased.

The electrode 20 has at least the silver-containing layer. Here, "silver-containing layer" means a layer comprising silver or a silver alloy. Examples of silver alloys include alloys of silver with one type or two or more types of electrode materials selected from a group comprising Pt, Co, Au, Pd, Ti, Mn, V, Cr, Zr, Rh, Cu, Al, Mg, Bi, Sn, Ir, Ga, Nd and Re. Furthermore, nickel is difficult to alloy with silver, but the element nickel can also be included in the silver layer. The composition of the silver-containing layer can also be changed depending on its distance from the semiconductor layer 15. For example, the silver-containing layer may be one which has a silver film in contact with the semiconductor layer 15 and a silver alloy or the like with a gradually reduced percentage of silver depending on its distance from the semiconductor layer 15.

The electrode 20 can be constituted from the silver-containing layer alone, but if the silver-containing layer is in contact with the semiconductor layer 15, a layer is preferably formed from an electrode material that does not contain silver or a silver alloy. For example, single layer of one type or two or more types of metal selected from the group including the abovementioned electrode materials and nickel or alloys thereof, or laminated layer thereof is preferably.

In particular, it is preferable to arrange a metallic film that is substantially unreactive with silver to be in contact with the silver-containing layer.

For example, as preferred examples, the electrode 20 preferably includes a two-layer structure in which the upper layer is a metal that is substantially unreactive with silver and the lower layer is silver or a silver alloy; a two-layer structure in which the upper layer is a noble metal and the lower layer is silver or a silver alloy; a three-layer structure in which the upper layer is a noble metal, the middle layer is a metal that is substantially unreactive with silver and the lower layer is silver or a silver alloy; a four-layer structure in which the upper two layers are noble metals, the middle layer is a metal that is substantially unreactive with silver and the lower layer is silver or a silver alloy. Examples of noble metals here include the platinum group metals, among which Pt is preferred.

The "metal substantially unreactive with silver" means a metal that is substantially unreactive with silver at temperatures of 1000° C. and below, and specific examples include nickel (Ni), ruthenium (Ru), osmium (Os), iridium (Ir), titanium (Ti), vanadium (V), niobium (Nb), tantalum (Ta), cobalt (Co), iron (Fe), chromium (Cr), tungsten (W), and the like. Among these, nickel is preferable.

Without being limiting in any particular way, examples of the film thickness of the electrode 20 in the case of the laminated structure include a total thickness of about 50 nm to 5 μm, or 50 nm to 1 μm, and the thickness of the silver-containing layer can be appropriately adjusted within these film thickness ranges. Moreover, in the case of the laminated structure, due to the ease of the manufacturing processes for laminating films onto the silver-containing layer, they can be appropriately formed in the same shape by using patterning in the same process. In the case of the silver-containing single layer, specific examples of film thicknesses for effectively reflecting the light from the light emitting layer include about 20 nm to 1 μm, about 50 nm to 300 nm, and preferably about 100 nm.

Second Electrode 21

A second electrode 21 is usually formed to be electrically connected with the electrode 20 on the upper surface thereof to functionally obtain a pad electrode.

The position, size, and the like of the second electrode 21 can be suitably adjusted within the semiconductor light emitting element 10 to the shape and size of the electrode 20, and it is also preferably formed so as to have at least only partial contact with the electrode 20. In this way, the surface area that reflects light coming from the light emitting layer can be better maintained, the absorption of light in the second electrode 21 can be minimized, and the reflection efficiency can be increased.

For example, by using a flip-chip mounting (face down mounting), when the semiconductor light emitting element of the present invention is constituted so as to be mounted on a supporting substrate, it is preferable to arrange the second electrode 21 on a comparatively larger surface area on the upper surface of the electrode 20. In this way, a current supply can be realized over a large surface area, and uniform light emission can be maintained.

The second electrode 21 is preferably formed by appropriate adjustment to have a laminated structure or a surface layer with consideration for the adhesion of a conductive wire used for wire bonding, and thicknesses that can withstand the impact during wire bonding.

Examples of the second electrode 21 include single layer and multilayer films of the metals such as zinc (Zn), nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag), yttrium (Y), gold (Au), aluminum (Al), and the alloys thereof, and conductive oxide films such as ITO, $ZnO_2$ and SnO, and the alloys of Al, Si and Cu (Al—Si—Cu-alloys).

For example, a platinum single layer film; a film with a two-layer structure in which the upper layer is gold and the lower layer is platinum; a film with a three-layer structure in which the upper layer is platinum, the middle layer is gold, and the lower layer is platinum; a film with a three-layer structure in which the upper layer is gold, the middle layer is platinum, and the lower layer is titanium; and a film with a four-layer structure in which the upper most layer is gold, the upper layer is platinum, the middle layer is titanium, and the lower layer is an alloy of Al—Si—Cu.

In particular, when the electrode 20 is a silver-containing single layer, as mentioned above, it is preferable to arrange the metal that is substantially unreactive to silver in a region in which the second electrode 21 is at least minimally in contact with the electrode 20. In addition, the second electrode 21 is preferably arranged on the upper side (connection region) of a conductive material, for example, gold, platinum, or the like, that is usually used for connection with the other terminal, such as by wire bonding. Furthermore, it is preferable for a material with good adhesion to the insulating layer, described below, to be arranged on the upper surface of the second electrode 21.

The film thickness of the second electrode can be appropriately set so that the second electrode will be comparatively thicker when a gold bamp is formed thereabove, and the second electrode will comparatively thinner when a eutectic bamp (Au—Sn, or the like) is formed thereabove. Specifically, it is preferable to appropriately adjust the total thickness to be within the range of about 100 nm to 1000 nm.

Insulating Layer

An insulating layer 22 is coated over at least the side surface of the silver-containing layer from the upper surface of the semiconductor layer 15, in particular of the second conductivity type semiconductor layer 14.

As long as that the insulating layer 22 closely adheres to and coats the entire exposed surface (the exposed surface from the other electrode materials, usually the side surface of the silver-containing layer) of the silver-containing layer that constitutes the electrode 20, the insulating layer 22 may coat one or more or all of (i) the upper surface of the second conductivity type semiconductor layer 14 that is exposed from the electrode 20, (ii) the side surface of the electrode 20 other than the silver-containing layer, (iii) the upper surface of the electrode 20 that is not in contact with the abovementioned second electrode 21, (iv) the side surface of the second electrode 21, and (v) part of the upper surface of the second electrode 21.

Depending on the wavelength of the light outgoing from the light emitting layer, the insulating layer 22 is preferably formed from a material that is comparatively non-absorbent of this light. For example, the use of an oxide layer, nitride layer, or the like is preferred, and an oxide layer is further preferred. Examples of the oxide layer include $Al_2O_3$, $SiO_2$, SiN, HfO, $TiO_2$, $SiO_xN_y$, and the like, and examples of the nitride layer include SiN, TiN and the like, it may be a single layer or laminated layer. Among these, an $Al_2O_3$ single layer or a laminated layer of $Al_2O_3$ and $SiO_2$ or the like is preferred, and arranging to coat the electrode 20 with $Al_2O_3$ is further preferred.

Thus, closely adhering and coating the insulating layer 22 of $Al_2O_3$ or the like onto the exposed surface of the silver-containing layer can effectively prevent the migration of the silver. Additionally, by using an insulating layer 22 that poorly absorbs the light, the absorption of light from the light emitting layer 13 can be minimized and the light extraction efficiency can be increased.

The thickness of the insulating layer 22 may be about 10 to 100 nm, preferably about 20 to 90 nm, and more preferably 20 to 60 nm.

A layer formed using atomic layer deposition is suitable as the insulating layer 22. The atomic layer deposition (ALD) method is a film forming method in which generally two or more types of gaseous raw materials are alternately supplied to a reaction chamber, and chemical reactions are caused on a surface to be coated such as the wafer surface, therefore a high accuracy film with a thickness corresponding to a mono-atomic layer can be formed in each cycle. In addition, it is possible to form a film with little thermal history and excellent step coverage. Consequently, the silver-containing layer can be coated reliably, and migration of the silver can be prevented effectively.

Figure 2:
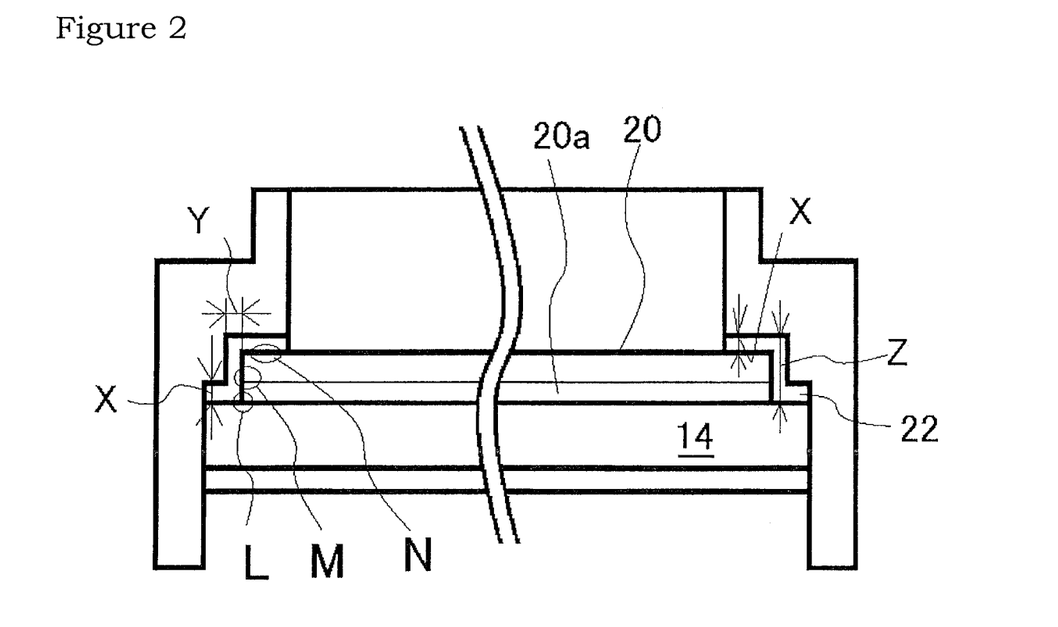
FIG. 2 is a schematic cross-sectional expanded diagram of the main portion of the semiconductor light emitting element to illustrate the thickness of the insulating layer.

The atomic layer deposition method is, because gaseous raw materials can be supplied isotropically and undergo chemical reactions to a surface to be coated, possible to form a layer with substantially the same thickness as that on the upper surfaces N of the electrode or the wafer where the gradient angle is substantially 0°, as shown in FIG. 2, on a surface where the gradient angle to the upper surface of the electrode or the wafer (N in FIG. 2) is close to perpendicular (M in FIG. 2) such as the side surface of the electrode, and additionally on the corner region (L in FIG. 2) where two or more surfaces are joined, which is different from formation of an insulating layer by conventional methods such as the sputtering method, vapor deposition method, CVD method, or the like, for example, in other words, with a substantially uniform thickness across the entire layer. In particular, since the insulating layer can be coated to a substantially uniform thickness on the exposed surface of the silver-containing electrode (usually, the side surface), the junction sites of the silver-containing electrode with other materials (contact sites between the silver-containing electrode and the second conductivity type semiconductor) or corner sites, the prevention of silver migration can be better maintained.

Here, "thickness" means the length in the direction of the atomic layers laminated by layer lamination. Consequently, thickness in the upper surfaces of the second conductivity type semiconductor layer 14 and the upper surface of the electrode 20 is indicated as the film thickness represented by X in FIG. 2, while thickness in the side surfaces of the silver-containing electrode 20a and the electrode 20 is not the film thickness represented by Z, but rather is indicated as the film thickness represented by Y. Because of this, the film thickness in a corner portion L is substantially the same thickness as the thickness represented by X and Y. In practice, this thickness can be measured using SEM, or TEM, or the like, at a cross section at the site of the film formation.

Additionally, "substantially uniform thickness" means minimal fluctuations in thickness at sites in the formed film. For example, it is suitable for the variations in thickness to fall within about ±20%, preferably within about ±15%, more preferably within about ±10%, and still more preferably within about ±8%.

Substrate

Examples of substrate 11 that can be used include known insulating substrate and conductive substrate, such as sapphire, spinel, SiC, nitride semiconductor, e.g., GaN, and GaAs. The insulating substrate may be eventually removed, but need not be removed.

In the case where the insulating substrate is not eventually removed, usually both a p-side electrode and a n-side electrode are formed on the same side of the semiconductor layer 15 (see FIGS. 1A and 1B). Moreover, in the case where the insulating substrate is eventually removed or the case wherein a semiconductor substrate is used, the p-side electrode and the n-side electrode can be formed on the same side of the semiconductor layer 15 or on respective different sides.

Semiconductor Layer

Without being limiting in any particular way for the first conductivity type semiconductor layer 12, the light emitting layer 13 and the second conductivity type semiconductor layer 14 which constitute the semiconductor layer 15, but a gallium nitride-based semiconductor compound such as $In_XAl_YGa_{1-X-Y}N$ ($0 \leq X$, $0 \leq Y$, $X+Y \leq 1$) can be used favorably. The nitride semiconductor layer may have a single layer structure, but may also have a laminated structure which includes layers different compositions or thicknesses, a superlattice structure or the like. In particular, a single quantum well structure or multiple quantum well structure in which thin layers producing a quantum effect is laminated is preferable for the light emitting layer 13.

Further, the semiconductor layer 15 may be usually a homo-structure, hetero-structure, or double hetero-structure having an MIS junction, a PIN junction, or a PN junction.

Without being limiting in any particular way for the thickness, it may be adjusted arbitrarily.

As the laminated structures of the semiconductor layer 15 include, for example, a buffer layer composed of an AlGaN, an undoped GaN layer, an n-side contact layer composed of an Si doped GaN, a superlattice structure in which GaN layers and InGaN layers alternately laminated, a light emitting layer having a multiple quantum well structure in which GaN layers and InGaN layers alternately laminated, a superlattice structure in which Mg doped AlGaN layers and Mg doped InGaN layers alternately laminated, and a p-side contact layer composed of an Mg doped GaN.

Electrode 30 on First Conductivity Type Semiconductor Layer Side

An electrode 30 of the first conductivity type semiconductor layer side (hereinafter may be referred to as "n-side electrode") can be formed from materials that can have ohmic contact with the first conductivity type semiconductor layer 12 in the surface where the first conductivity type semiconductor layer 12 is exposed by removing the semiconductor layer from the surface of the second conductivity type semiconductor layer 14. Examples thereof include metallic materials such as Al, Rh, W, Mo, Ti, V and conductive oxides such as ZnO, $In_2O_3$, $SnO_2$, ITO. The n-side electrode may be a single layer structure or a multilayer structure. Further, it may have the same laminated structure as the abovementioned second electrode. By selecting this laminated structure, it is possible to design a simplified manufacturing process using simultaneous lamination and simultaneous sputtering while forming the laminated structure for the second electrode.

Protective Film 32

Usually, a protective film 32 is formed on the side surface of the abovementioned semiconductor layer 15, the surface of the insulating layer 22, a portion of the second electrode 21, the exposed part 16 of the first conductivity type semiconductor layer 12, and a portion of the surface of the n-side electrode 30.

Examples of the protective film include a film composed of oxides, nitrides or oxynitrides selected from a group comprising Si, Ti, V, Zr, Nb, Hf, Ta. In particular, examples thereof include $SiO_2$, $ZrO_2$, SiN, BN, SiC, SiOC, AlN, AlGaN, and the like. The protective film 32 may be a single layer or a multilayer formed of a single material, or a laminated layer formed of different materials. The protective film preferably has a thickness of about 1 to 1000 nm.

Manufacturing Method for Semiconductor Light Emitting Element

Figure 4:
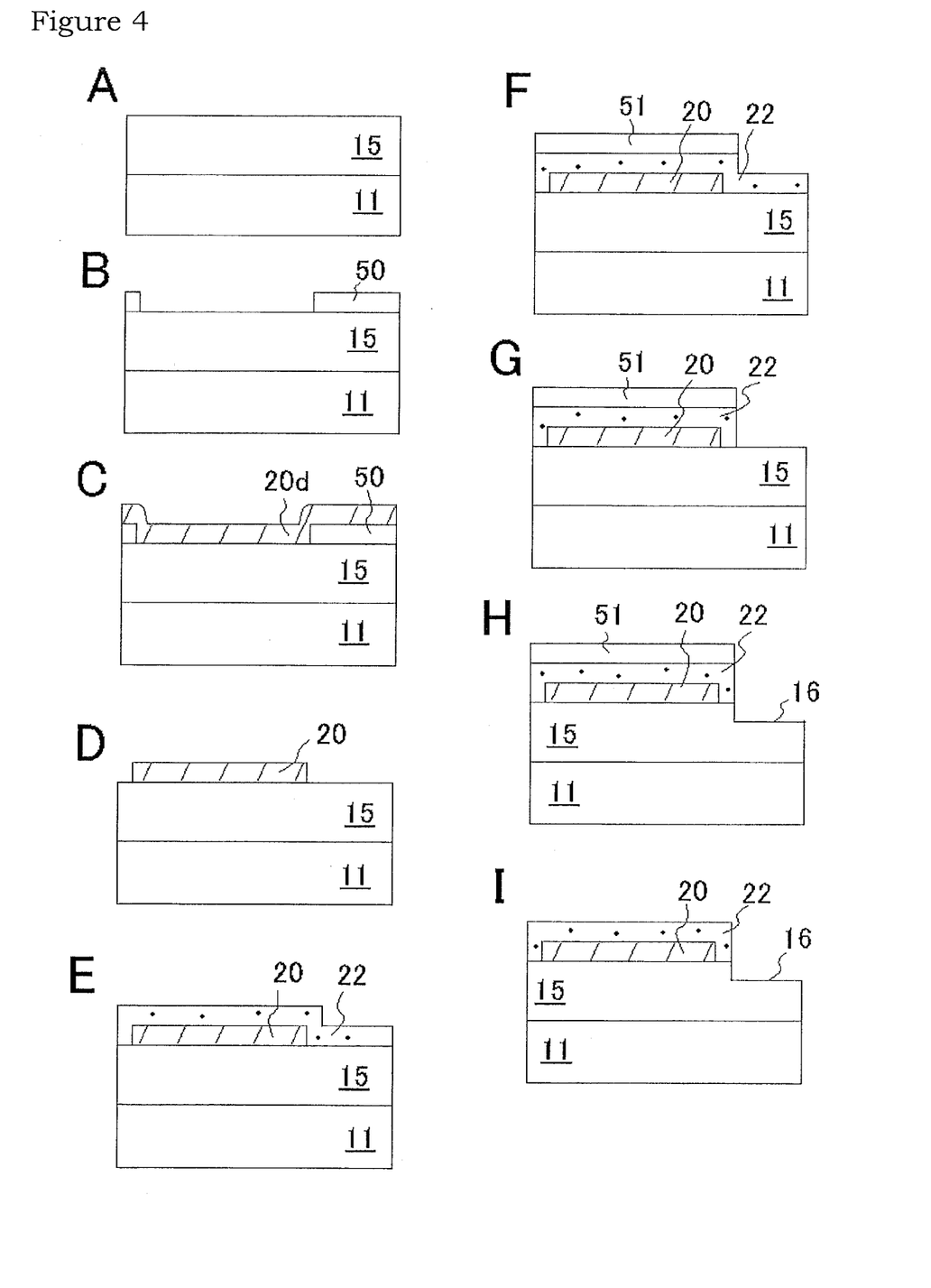
FIG. 4 is a schematic cross-sectional diagram illustrating a method for manufacturing a semiconductor light emitting device according to the present invention.

In a manufacturing method for the semiconductor light emitting element, first, the semiconductor layer 15 is formed on the substrate 11 composed of sapphire as shown in FIG. 4A. The semiconductor layer 15 can be formed using the methods commonly employed in the art by appropriately modifying the conditions to obtain the abovementioned semiconductor layer with a laminated structure.

The semiconductor layer can be formed by a known method such as MOVPE, MOCVD (Metal Organic Chemical Vapor Deposition), HVPE (Hydride Vapor Phase Epitaxy), MBE (Molecular Beam Epitaxy) or the like.

Next, the electrode 20 including a silver-containing layer is formed in contact with the upper surface of the second conductivity type semiconductor layer.

An electrode including the silver-containing layer can be formed using the methods commonly employed in the art by appropriately modifying the conditions to obtain the above-mentioned electrode structure.

For example, a resist pattern 50 is formed having an opening in the region designed to form the electrode, as shown in FIG. 4B, an electrode film 20d comprising a silver-containing film and optionally other metallic films is formed on the second conductivity type semiconductor layer in this order using known techniques such as vapor deposition, sputtering, or the like, as shown in FIG. 4C, and the electrode 20 including the silver-containing film is patterned in the desired shape using the lift-off method, as shown in FIG. 4D.

Thereafter, using the atomic layer deposition method, the insulating layer 22 is formed over the entire surface of the obtained substrate 11, as shown in FIG. 4E.

To forming a film using the atomic layer deposition method, firstly, the obtained semiconductor layer is arranged in the ALD apparatus, and an inert gas (nitrogen gas or argon gas) is introduced under reduced pressure conditions and the temperature is increased to a growth temperature of 400° C.

Subsequently, raw material gases (for example, TMA: trimethylaluminum; TEMAH: tetrakis(ethylmethyamino) hafnium) are supplied to the interior of the ALD apparatus, decomposed, and are adsorbed onto the surface to be coated to form a layer (essentially a monoatomic layer).

Next, the precursor gases are evacuated, and according to the need inert gas is supplied as a purge gas and then evacuated, since it is preferable to remove the precursor gas completely.

Subsequently, an oxide layer is formed through an oxidizing gas (for example, oxygen, ozone, water vapor, or the like) is supplied, and the reaction of the oxidizing gas with the layer formed on the surface to be coated. In addition, after the oxidizing treatment is completed, the oxidizing gas is evacuated, and according to the need the inert gas is supplied as a purge gas and then evacuated, since it is preferable to remove the oxidizing gas completely.

In this way, the raw material gas and the oxidizing gas are supplied alternately with the aim of growing an oxide film (for example, an $Al_2O_3$ film). The time periods for supplying the raw material gas and the oxidizing gas are each about 0.1 to several seconds. This supply of the raw material gas and the oxidizing gas is as one cycle, by carrying out for several hundred cycles of this, an $Al_2O_3$ layer with a thickness of a several tens nm can be formed.

Finally, after lowering the temperature, the semiconductor layer is removed from the ALD apparatus.

By using this method, a film of silicon dioxide ($SiO_2$), silicon nitride ($Si_3N_4$), aluminum oxide ($Al_2O_3$), hafnium oxide ($HfO_2$), titanium oxide ($TiO_2$), or the like of the desired thickness can be formed. In addition, by changing the above-mentioned raw material gas, laminated films of two or more layers with different compositions can be formed.

Next, using well-known methods such as photolithography as shown in FIG. 4F, an intended outer edge region of the second conductivity type semiconductor layer that is slightly larger than the electrode 20 including the silver-containing layer is coated using a mask pattern 51, such as a resist or the like, and the insulating layer 22 is patterned in the desired shape utilizing this mask pattern 51 as shown in FIG. 4G.

This patterning, for example, can be done by wet etching using an acidic solution as an etchant. Subsequently, the mask pattern 51 is left as is, the obtained substrate 11 is introduced into an RIE apparatus, and portions of the second conductivity type semiconductor layer 14, the active layer 13, and the first conductivity type semiconductor layer 12 can be etched so that the surface of the first conductivity type semiconductor layer 12 is exposed and one unit of the light emitting element region is defined as shown in FIG. 4H.

In this way, after the electrode 20 including the silver-containing layer has been formed, by exposing the first conductivity type semiconductor layer 12, it is possible to efficiently prevent silver migration due to potential differences between the p-layer and n-layer during the processing of the substrate.

Afterward, the mask pattern 51 is removed as shown in FIG. 4I.

Figure 5:
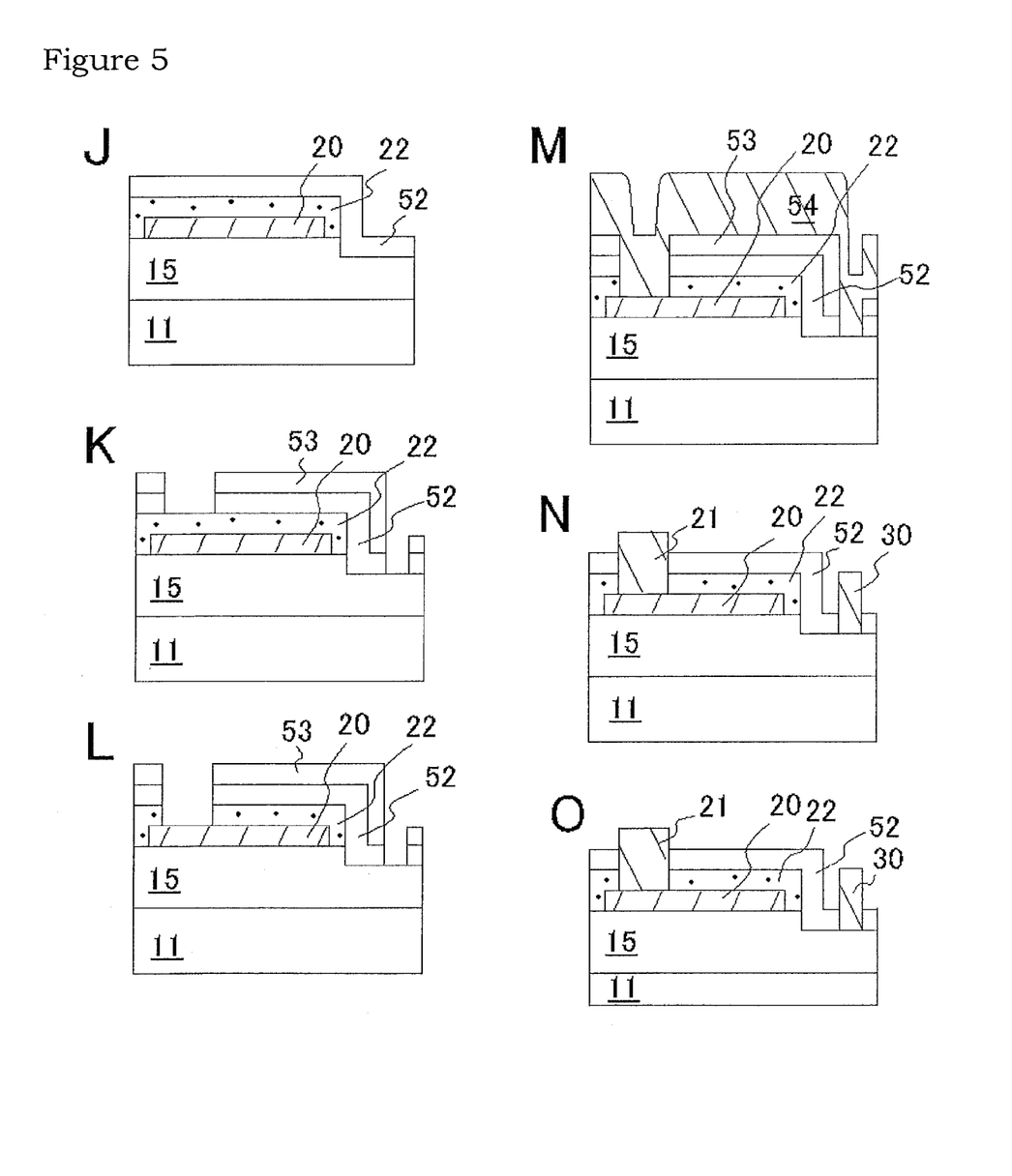
FIG. 5 is a schematic cross-sectional diagram illustrating a method for manufacturing a semiconductor light emitting device according to the present invention.

Next, for example, it is preferable to form a protective film 52 comprising $SiO_2$ on the surface of the obtained insulating layer 22, as shown in FIG. 5J.

The protective film can be formed by a method that is known in this field. For instance, this can be vapor deposition, sputtering, reactive sputtering, ECR plasma sputtering, magnetron sputtering, ion beam assist deposition, ion plating, laser ablation, CVD, spraying, spin coating, dipping, a combination of these two or more methods, a combination of these methods and an oxidation treatment (thermal treatment), or any of various other methods.

Next, it is preferable to form the second electrode and the n-side electrode.

When such electrodes are formed from the same material film, as shown in FIG. 5K, a resist pattern 53 having openings in the region where the second electrode and the n-side electrode to be formed is formed, the protective film 52 and the insulating layer 22 are removed using the resist pattern 53 as a mask by etching, and portions of the electrode 20 including the silver-containing layer or the first conductivity type semiconductor layer are exposed (see FIG. 5L).

On the obtained substrate 11, the second electrode and the n-side electrode material film 54 are formed as shown in FIG. 5M, the second electrode 21 is formed on the electrode 20 including the silver-containing layer, and the n-side electrode 30 is formed on the first conductivity type semiconductor layer, using the lift-off method as shown in FIG. 5N.

Furthermore, the formation of material films and patterning for the second electrodes 21 and the n-side electrodes 30 by can be carried out by separate steps or at optional stages, respectively.

In the manufacturing method for the light emitting semiconductor of the present invention, it is preferable to carry out annealing to obtain p-type conversion of the semiconductor layer or to obtain an ohmic connection at optional stage. Depending on the aim, this annealing can be carried out by methods commonly known in the art with the appropriate selection of conditions.

Additionally, at the optional stages, preferably after the formation of the protective film 52, the second electrode 21, and the n-side electrode 30, for example, as shown in FIG. 5O, it is preferable to grind or polish the back side of the substrate 11 to obtain the desired thickness. Here, for example, it can be appropriate to grind or polish to give the substrate thickness of about 50 to 150 μm.

Furthermore, at the optional stages, preferably after the grinding or polishing of the substrate, one unit of the light emitting element is obtained by splitting up the substrate and the semiconductor layer along with exposing the region of the first conductivity type semiconductor layer for defining the abovementioned one unit of the light emitting element region. In this case, it is preferable to split up the substrate and the semiconductor layer by carrying out laser irradiation optionally from the semiconductor layer side or the substrate side, forming scribed grooves from the semiconductor layer side or the substrate side, or utilizing methods well known to the art.

The semiconductor light emitting element and method for manufacturing the same are described in detail below.

Embodiment

As shown in FIGS. 1A and 1B, a semiconductor light emitting element 10 of this embodiment is formed of the semiconductor layer 15 laminated onto the substrate 11 consist of sapphire in this order the first conductivity type (for example, n-type) semiconductor 12, the light emitting layer 13, and the second conductivity type (for example, p-type) semiconductor 14, with multiple buffer layers or the like (not shown in the figures) interposed between the semiconductor layer 15 and the substrate 11. Portions of the semiconductor layer 15 are removed to form the exposed parts 16 that expose the n-type semiconductor 12 respectively.

The electrodes 20 including the silver-containing layer are formed on the entire surface of the second conductivity type semiconductor 14 except for the entire outer periphery of the semiconductor light emitting element 10 and the entire outer peripheries of the exposed parts 16 within the element. Each of the electrodes 20 is in direct contact with the silver film (film thickness: 100 nm) on the second conductivity type semiconductor 14, and ohmically connected. On the silver film are formed in the following order a Ni film (film thickness: 100 nm), a Ti film (film thickness: 100 nm), and a Pt film (film thickness: 100 nm). Such silver films, Ni films, Ti films, and Pt films are patterned to have the same shape, and their side surfaces are formed to be substantially flush.

The second electrode 21 is formed on the each of the electrodes 20 to function as the pad electrode. Electric current can be supplied to the entirety of the second conductivity type semiconductor 14 using this second electrode 21. For example, the second electrode 21 can be formed at 4 locations along the extended length of the exposed portion 16. This second electrode 21 can be constituted by laminating in order from the electrode 20 side an Al—Si—Cu alloy film (film thickness: 500 nm), a Ti film (film thickness: 150 nm), a Pt film (film thickness: 50 nm), and an Au film (film thickness: 450 nm).

The insulating layer 22 comprising $Al_2O_3$ is coated onto the entire side surface of the each of the electrodes 20, the upper surface of the electrode 20 that does not form the second electrode 21, the side surface of the second electrode 21, and the upper surface of the second electrode 21 that is not wire bonded (not shown) from the upper surface of the second conductivity type semiconductor layer 14. The insulating layer 22 has a thickness of 30 nm (± about 2.0%), and is formed by the ALD method on both the top surface and the side surface.

In the semiconductor light emitting element, the electrode is formed the bottommost layer of silver layer over substantially the entire surface on the second conductivity type semiconductor layer the reflection is often extremely efficient, which can increase the efficiency of light extraction. Moreover, since the silver layer is not exposed, and is coated, even in the corners and on the side surfaces, highly accurately with a substantially uniform thickness of $Al_2O_3$, silver migration does not occur and it is possible to obtain a highly reliable light emitting element.

The semiconductor light emitting element can be prepared according to the manufacturing method below.

Formation of Semiconductor Layer

As shown in FIG. 4A, a buffer layer comprising $Al_{0.1}Ga_{0.9}N$ with the thickness of 10 nm, a non-doped GaN layer with the thickness of 1.5 μm, an n-type contact layer comprising Si-doped GaN with the thickness of 2.165 μm, and a superlattice n-type cladding layer with the thickness of 64 nm a GaN layer with the thickness of 4 nm and an InGaN layer with the thickness of 2 nm alternately laminated on the n-type contact layer for 10 cycles, as the first conductivity type semiconductor layer 14, are formed on the substrate 11 of sapphire using a MOVPE reactor. On top of this, a multi-quantum well structure light emitting layer 16 (total film thickness: 123 nm) is formed with firstly a well layer comprising $In_{0.3}Ga_{0.7}N$ with a film thickness of 3 nm and a barrier layer comprising undoped GaN with a film thickness of 15 nm, with 6 layers of each being laminated repeatedly and alternatively starting from the barrier layer, and with finally the barrier layer laminated on top. On top of this, a superlattice p-type clad layer with the thickness of 0.2 μm of a Mg-doped $Al_{0.1}Ga_{0.9}N$ layer (4 nm) and a Mg-doped InGaN (2 nm) alternately laminated for 10 cycles, and a p-type contact layer comprising Mg-doped GaN with the thickness of 0.5 μm, as the second conductivity type semiconductor layer 18, are formed in order to obtain a wafer.

The obtained wafer is annealed at 600° C. inside the reactor under a nitrogen atmosphere to further lower the resistance of the p-type cladding layer and the p-type contact layer.

Formation of Electrode

After annealing, the wafer is removed from the reactor, and a resist pattern 50 having patterns of predetermined shape is used as shown in FIG. 4B, the wafer is placed in the sputtering device and the electrode film 20d constituted as an electrode containing a silver film, a Ni film, a Ti film, and a Pt film is formed as shown in FIG. 4C. Afterward, using the lift-off method as shown in FIG. 4D, the electrode film 20d is patterned into the electrode 20 with the desired shape.

Formation of Insulating Layer

The obtained wafer is placed in the ALD apparatus as shown in FIG. 4E, and the semiconductor layer 15 and the electrode 20 are coated by forming an $Al_2O_3$ film with the thickness of 30 nm as the insulating layer.

The conditions are as shown below;
Temperature of layer formation: 200° C.
Raw material gas: TMA,
Oxidation gas: water vapor,
Purge gas: Ar gas.

Afterward, ohmic annealing is carried out inside the reactor at 600° C. under a nitrogen atmosphere.

Next, a mask pattern 51 of the desired shape is used as shown in FIG. 4F, the insulating layer 22 is patterned in the desired shape as shown in FIG. 4G, etching of the semiconductor layer 15 is carried out as shown in FIG. 4H to form the exposed part 16 that exposes the surface of the first conductivity type semiconductor layer 12, and the mask pattern 51 is removed as shown in FIG. 4I.

Afterward, the protective film 52 is formed in the predetermined shape on the surface of the obtained wafer as shown in FIG. 5J, and the protective film 52 is removed from the upper portion of the electrode 20 and the exposed part 16 using a mask pattern 53 as shown in FIG. 5K, and the insulating layer 22 is removed as shown in FIG. 5L. An electrode material film 54 is formed on the entire surface including on the mask pattern 53 as shown in FIG. 5M, and the second electrode 21 and the n-side electrode 30 are formed using the lift-off method as shown in FIG. 5N.

Furthermore, the substrate 11 consist of sapphire is thinned by polishing to the bottom surface as shown in FIG. 5O, and then semiconductor light emitting element chips are formed by scribing.

Evaluation of Light Output

In the obtained semiconductor light emitting elements (n=5 pcs) as above, a 350 mA current was passed through to cause light emission and this light output was measured.

In addition, a semiconductor light emitting element having an electrode structure which has been confirmed that it was possible to effectively avoid silver migration in the silver-containing layer was prepared as a comparative example.

Figure 3:
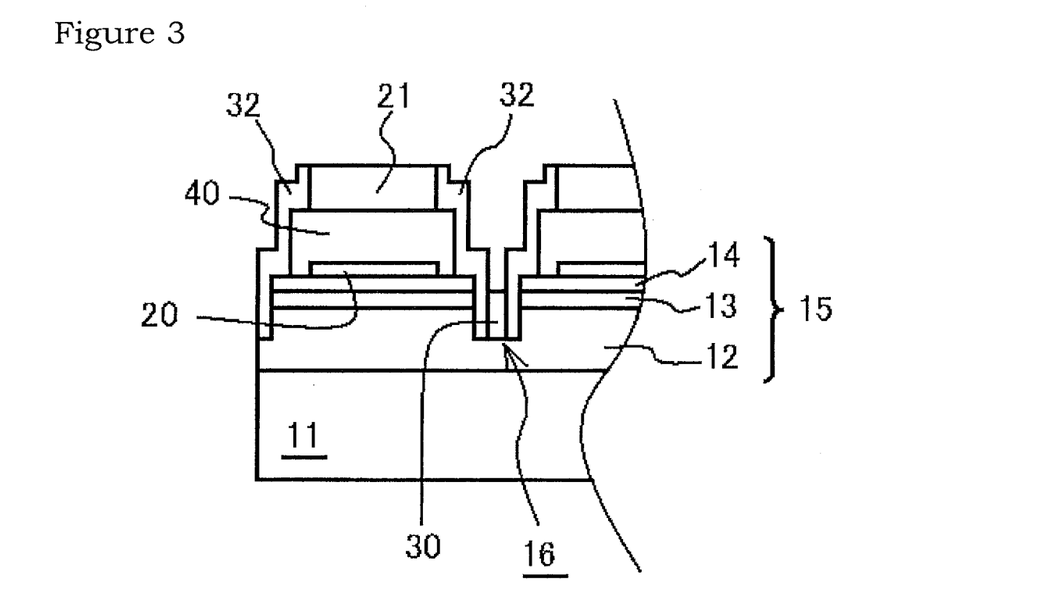
FIG. 3 is a schematic cross-sectional expanded diagram of the main portion of the semiconductor light emitting element of a comparative example to an embodiment of the present invention.

In the semiconductor light emitting element of the comparative example, as shown in FIG. 3, the semiconductor layer 15, the laminated structure of the electrode 20, the protective film 32, and the second electrode 21 have the same structures as in Embodiment 1, except that a protective metallic layer 40 is formed on the electrode 20 to cover the upper surface and the side surfaces of the electrode 20. Furthermore, the protective metallic layer 40 had the structure of a Ti with a film thickness of 2 nm, an Au with a film thickness of 1700 nm, a W with a film thickness of 100 nm, and a Ti with a film thickness of 3 nm from the electrode 20 side and in order.

In the light emitting element of the comparative examples (n=5 pcs), light was emitted by passing through a current of 350 mA in the same manner as above, and this light output was measured.

The results were that both light emitting elements exhibited the same forward voltage Vf, and the light output of the light emitting elements of Embodiment 1 were confirmed to increase by an approximate average of 9%. Furthermore, the trend of increase light output in the embodiments was confirmed in all of the elements measured.

Evaluation of Prevention of Silver Migration

To evaluate the prevention of silver migration as the experimental examples, an electrode structure A was formed by forming an electrode on the surface of the semiconductor layer using the same methods mentioned above, and coating an $Al_2O_3$ film of thickness 30 nm on this surface using the ALD method and an $SiO_2$ film of thickness 30 nm using the sputtering method.

Moreover, as Comparative Examples 1, as shown in FIG. 3, an electrode structure A comprising the electrode 20 and the protective metallic layer 40, which was conventionally confirmed that it was possible to effectively avoid silver migration in the silver-containing layer, and the electrode 20 was coated with an $SiO_2$ film of thickness 300 nm as the insulating film formed using the sputtering method, thereby forming an electrode structure B.

Furthermore, in the above experimental example, the $Al_2O_3$ film of thickness 30 nm was formed using the ALD method and the $SiO_2$ film of thickness 30 nm was formed using the sputtering method, but in comparative example 2, a element having an electrode structure C was formed instead, by the same method as in the above experimental example, except for forming an $SiO_2$ film of thickness 300 nm by the sputtering method.

In addition, in the above experimental example, the $Al_2O_3$ film of thickness 30 nm was formed as the insulating layer using the ALD method, but in Comparative example 3, a element having an electrode structure D was formed instead, by the same method as in the above experiment example, except for forming an $Al_2O_3$ film of thickness 30 nm by the sputtering method and forming an $SiO_2$ film of thickness 30 nm by the sputtering method in the same manner as in the above experiment example.

After these electrode structures were cleaned for 16 hours in ultrapure water while passing ultrasonic waves therethrough, the silver-containing layers were measured for any migration of silver. Microscope observation was carried out for the external appearance of the electrode structure to determine the presence or absence of silver migration.

In the results, silver migration was observed in electrode structures B, C, and D, but no occurrence of silver migration was observed in electrode structure A and the electrode structure according to Embodiment 1.

The semiconductor light emitting elements and the method for Manufacturing thereof according to the present invention may be used for various type of light emitting device such as light sources for lighting, light sources for various types of indicators, light sources for vehicle, display light sources, light sources for liquid-crystal back light, light sources for sensors, traffic lights and the like, and the method for Manufacturing thereof.

DESCRIPTION OF THE NUMERALS 10 semiconductor light emitting element; 11 substrate; 12 first conductivity type semiconductor layer; 13 light emitting layer; 14 second conductivity type semiconductor layer; 15 semiconductor layer; 16 exposed portion; 20 electrode; 20a silver-containing electrode; 20d electrode film; 21 second electrode; 22 insulating layer; 30 n-side electrode; 32 protective film; 40 protective metallic layer; 50, 53 resist pattern; 51 mask pattern; 52 protective film; and 54 electrode material film.

The invention claimed is:

1. A method for manufacturing a semiconductor light emitting element comprising:
    forming a semiconductor layer laminated of a first conductivity type semiconductor layer, a light emitting layer and a second conductivity type semiconductor layer, in this order;
    forming an electrode including a silver-containing layer in contact with an upper surface of the second conductivity type semiconductor layer; and
    forming an insulating layer by an atomic layer deposition method, the insulating layer including a first portion coating over at least a side surface of the silver-containing layer from the upper surface of the second conductivity type semiconductor layer, and a second portion extending away from the first portion along the upper surface of the second conductivity type semiconductor layer, the first portion and the second portion of the insulating layer having a substantially uniform thickness.

2. The method for manufacturing of the semiconductor light emitting element according to claim 1, wherein
    the insulating layer is an aluminum oxide or silicon dioxide.

3. The method for manufacturing of the semiconductor light emitting element according to claim 2, wherein
    the insulating layer has substantially uniform thickness such that the variations in thickness falls within ±20%.

4. The method for manufacturing of the semiconductor light emitting element according to claim 1, wherein
    the insulating layer has substantially uniform thickness such that the variations in thickness falls within ±20%.

5. The semiconductor light emitting element according to claim 1, wherein
    a thickness of the insulating layer is about 10 to 100 nm.

6. A semiconductor light emitting element comprising:
    a semiconductor layer laminated of a first conductivity type semiconductor layer, a light emitting layer and a second conductivity type semiconductor layer, in this order;
    an electrode including a silver-containing layer in contact with an upper surface of the second conductivity type semiconductor layer; and
    an insulating layer coating over at least a side surface of the silver-containing layer from the upper surface of the second conductivity type semiconductor layer,
    the insulating layer having substantially uniform thickness over at least the entire upper surface of the second conductivity type semiconductor layer and a side surface of the silver-containing layer from the upper surface of the second conductivity type semiconductor layer, an end surface of the insulating layer being flush with the side surface of the second conductivity type semiconductor layer.

7. The semiconductor light emitting element according to claim 6, wherein
    the insulating layer is a layer formed by an atomic layer deposition method.

8. The semiconductor light emitting element according to claim 7, wherein
the insulating layer is an aluminum oxide or silicon dioxide.

9. The semiconductor light emitting element according to claim 7, wherein
the insulating layer has substantially uniform thickness such that the variations in thickness falls within ±20%.

10. The semiconductor light emitting element according to claim 6, wherein
the insulating layer is an aluminum oxide or silicon dioxide.

11. The semiconductor light emitting element according to claim 10, wherein
the insulating layer has substantially uniform thickness such that the variations in thickness falls within ±20%.

12. The semiconductor light emitting element according to claim 6, wherein
the insulating layer has substantially uniform thickness such that the variations in thickness falls within ±20%.

13. The semiconductor light emitting element according to claim 12, wherein
a thickness of the insulating layer is about 10 to 100 nm.

14. The semiconductor light emitting element according to claim 6, wherein
a thickness of the insulating layer is about 10 to 100 nm.

15. A semiconductor light emitting element comprising:
a semiconductor layer laminated of a first conductivity type semiconductor layer, a light emitting layer and a second conductivity type semiconductor layer, in this order;
an electrode including a silver-containing layer in contact with an upper surface of the second conductivity type semiconductor layer; and
an insulating layer coating over at least a side surface of the silver-containing layer from the upper surface of the second conductivity type semiconductor layer,
the insulating layer having a substantially uniform thickness covering at least a side surface of the silver-containing layer from the upper surface of the second conductivity type semiconductor layer, and extending along the upper surface of the second conductivity type semiconductor layer from a portion adjacent to the side surface of the silver-containing layer toward a direction away from the side surface of the silver-containing layer.

16. The semiconductor light emitting element according to claim 15, wherein
the insulating layer is a layer formed by an atomic layer deposition method.

17. The semiconductor light emitting element according to claim 15, wherein
the insulating layer is an aluminum oxide or silicon dioxide.

18. The semiconductor light emitting element according to claim 15, wherein
the insulating layer has substantially uniform thickness such that the variations in thickness falls within ±20%.

19. The semiconductor light emitting element according to claim 18, wherein
a thickness of the insulating layer is about 10 to 100 nm.

20. The semiconductor light emitting element according to claim 15, wherein
a thickness of the insulating layer is about 10 to 100 nm.

* * * * *